(12) United States Patent
Oshige (10) Patent No.: US 11,181,767 B2
(45) Date of Patent: Nov. 23, 2021

(54) SEMICONDUCTOR APPARATUS, MODULE, CAMERA, AND EQUIPMENT

(71) Applicant: CANON KABUSHIKI KAISHA, Tokyo (JP)

(72) Inventor: Hidemasa Oshige, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 10 days.

(21) Appl. No.: 16/667,646

(22) Filed: Oct. 29, 2019

(65) Prior Publication Data
US 2020/0133054 A1    Apr. 30, 2020

(30) Foreign Application Priority Data
Oct. 31, 2018  (JP) .............................. JP2018-205557

(51) Int. Cl.
*G02F 1/1335* (2006.01)
*G02F 1/1362* (2006.01)
*G02F 1/1343* (2006.01)

(52) U.S. Cl.
CPC .. *G02F 1/133514* (2013.01); *G02F 1/133512* (2013.01); *G02F 1/134336* (2013.01); *G02F 1/136227* (2013.01)

(58) Field of Classification Search
None
See application file for complete search history.

(56) References Cited

U.S. PATENT DOCUMENTS

| | | | | |
|---|---|---|---|---|
| 5,844,645 A | * | 12/1998 | Kashimoto | ....... G02F 1/133512 349/106 |
| 5,936,694 A | * | 8/1999 | Suzuki | .............. G02F 1/134336 349/151 |
| 2003/0076572 A1 | | 4/2003 | Kawase | |
| 2003/0137621 A1 | | 7/2003 | Zhang et al. | |
| 2005/0270472 A1 | * | 12/2005 | Yamada | .............. G02F 1/13394 349/156 |
| 2006/0244923 A1 | * | 11/2006 | Mitani | ................ G02F 1/13336 353/31 |
| 2008/0291370 A1 | * | 11/2008 | Kurosawa | ......... G02F 1/133753 349/96 |
| 2013/0258263 A1 | * | 10/2013 | Yasukawa | ............. G02F 1/1345 349/138 |
| 2014/0016077 A1 | * | 1/2014 | Chou | .................... G02F 1/1339 349/153 |
| 2014/0347612 A1 | * | 11/2014 | Park | .................. G02F 1/133514 349/106 |

(Continued)

FOREIGN PATENT DOCUMENTS

| | | |
|---|---|---|
| JP | 2615960 B2 | 6/1997 |
| JP | H11-064837 A | 3/1999 |

(Continued)

*Primary Examiner* — Ryan Crockett
(74) *Attorney, Agent, or Firm* — Canon U.S.A., Inc., IP Division (57) ABSTRACT

A semiconductor apparatus according to an embodiment of the present disclosure, in a plan view with respect to the primary face of a semiconductor device, includes at least a part of an outer edge of a color filter layer being located between an effective pixel region and a joining member, and the distance from the effective pixel region to at least a part of the outer edge is greater than the distance from the color filter layer to a light transmission plate in the effective pixel region.

24 Claims, 6 Drawing Sheets

(56) References Cited

U.S. PATENT DOCUMENTS

| | | | |
|---|---|---|---|
| 2015/0060821 A1* | 3/2015 | Furuie | H01L 51/5253 257/40 |
| 2015/0378227 A1* | 12/2015 | Miyoshi | G02F 1/133512 349/43 |
| 2018/0275437 A1* | 9/2018 | Nishiwaki | G02F 1/1339 |
| 2018/0329260 A1* | 11/2018 | Mizusaki | G02F 1/133711 |

FOREIGN PATENT DOCUMENTS

| | | |
|---|---|---|
| JP | H11-067457 A | 3/1999 |
| JP | 2016-157566 A | 9/2016 |

\* cited by examiner

SEMICONDUCTOR APPARATUS, MODULE, CAMERA, AND EQUIPMENT

BACKGROUND OF THE INVENTION

Field of the Invention

The present disclosure relates to a semiconductor apparatus having a color filter layer.

Description of the Related Art

In a semiconductor apparatus that performs capturing or display, a color filter layer is provided in order to capture or display a color image. To protect a semiconductor apparatus, a light transmission plate facing the semiconductor device is provided. The light transmission plate is joined to the semiconductor device by a joining member. The color filter layer is located between the light transmission plate and the semiconductor device.

Japanese Patent Application Laid-Open No. 2016-157566 discloses a display apparatus provided with a color filter between a substrate and a semiconductor substrate arranged via a substrate gap setting portion.

SUMMARY OF THE INVENTION

An embodiment of the present disclosure includes: a semiconductor device having an effective pixel region in which an effective pixel is arranged and a peripheral region located in a periphery of the effective pixel region; a light transmission plate arranged to face the effective pixel region and the peripheral region; a color filter layer arranged between the light transmission plate and the effective pixel region and between the light transmission plate and the peripheral region; and a joining member arranged between the light transmission plate and the peripheral region and configured to join the light transmission plate and the semiconductor device, at least a part of an outer edge of the color filter layer is located between the effective pixel region and the joining member in the plan view with respect to the primary face of the semiconductor device, and a first distance from the effective pixel region to the part is greater than a second distance from the color filter layer to the light transmission plate in the effective pixel region.

Further features of the present disclosure will become apparent from the following description of exemplary embodiments with reference to the attached drawings.

DESCRIPTION OF THE EMBODIMENTS

Preferred embodiments of the present disclosure will now be described in detail in accordance with the accompanying drawings.

Figure 1A:
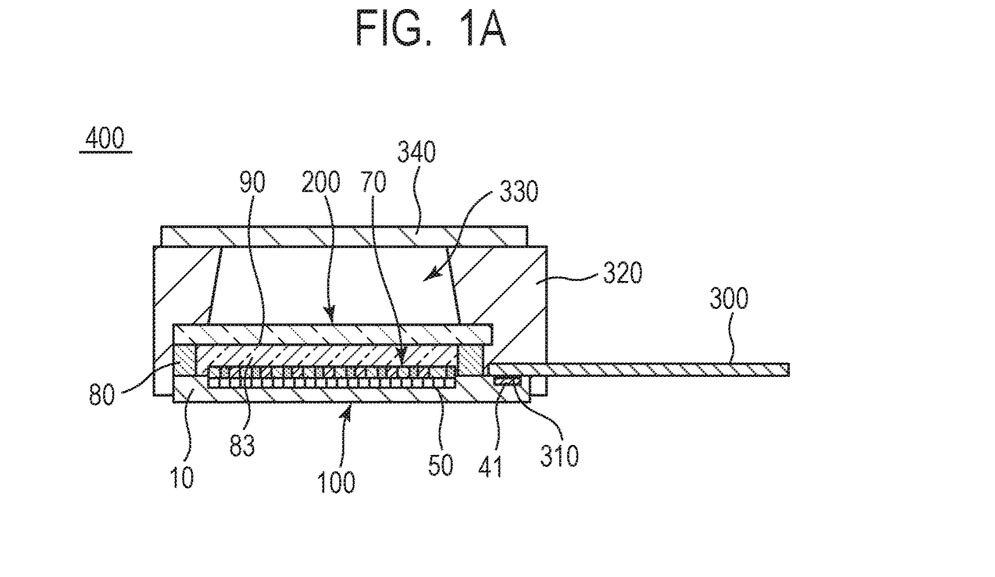
FIG. 1A is a sectional view illustrating a module and a semiconductor apparatus according to an embodiment of the present disclosure.

FIG. 1A is a sectional view of a module 400 having a semiconductor apparatus 200. The semiconductor apparatus 200 has a semiconductor device 100, a color filter layer 70, a light transmission plate 90 arranged to face the color filter layer 70, a joining member 80 that joins the light transmission plate 90 to the semiconductor device 100. As illustrated in FIG. 1A, the semiconductor apparatus 200 is provided between the color filter layer 70 and the light transmission plate 90 and may further have a light transmission member 83 contacting with the light transmission plate 90. Note that the light transmission member 83 may be omitted, or alternatively, an air gap may be provided between the color filter layer 70 and the light transmission plate 90.

The module 400 has a flexible circuit board 300 connected to an external connection terminal 41 of the semiconductor apparatus 200. An electrical connection portion between the external connection terminal 41 and the flexible circuit board 300 is formed of a conductive member 310 such as a solder, an anisotropic conductive film (ACF), or the like. The module 400 can further have a frame member 320 fixed to the semiconductor apparatus 200 and a cover 340 fixed to the frame member 320 and covering the light transmission plate 90. A space 330 surrounded by the frame member 320 is located between the cover 340 and the light transmission plate 90. The semiconductor apparatus 200 of the present embodiment is a display apparatus or an imaging apparatus, the semiconductor device 100 is a display device or an imaging device, and the module 400 is a display module or an imaging module.

Figure 1B:
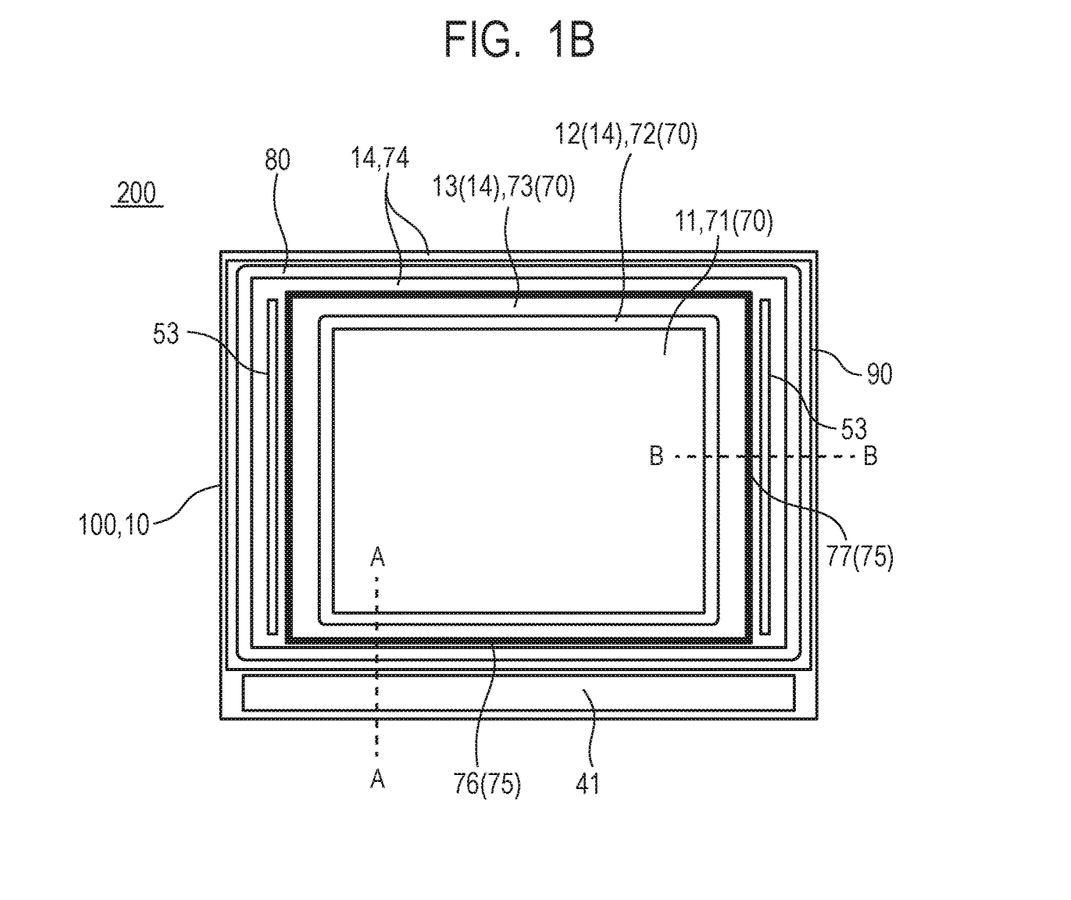
FIG. 1B is a plan view illustrating the semiconductor apparatus according to an embodiment of the present disclosure.

FIG. 1B illustrates a plan view when the semiconductor apparatus 200 is viewed in a plan view with respect to the primary face of the semiconductor device 100. The arrangement in a plan view is arrangement when the semiconductor apparatus 200 is viewed from a direction perpendicular to the primary face of the semiconductor device 100 (the normal direction of the primary face), and overlapped members can be seen through. In a plan view with respect to the primary face of the semiconductor device 100, the light transmission plate 90 overlaps the semiconductor device 100 and the color filter layer 70. A direction in which the light transmission plate 90 faces the semiconductor device 100 and the color filter layer 70 (the facing direction) is a direction perpendicular to the primary face of the semiconductor device 100 (the normal direction of the primary face).

The semiconductor device 100 has an effective pixel region 11 provided with an effective pixel and a peripheral region 14 located in the periphery of the effective pixel region 11. The effective pixel region 11 is a quadrangle, and the length of the diagonal line of the effective pixel region 11 is 5 to 50 mm, for example. The peripheral region 14 may include a peripheral circuit region 13 in which a peripheral circuit is arranged.

A peripheral circuit in the display apparatus includes a drive circuit used for driving the effective pixel or a processing circuit such as a digital-to-analog conversion circuit (DAC) that processes a signal input to the effective pixel. A peripheral circuit in the imaging apparatus includes a drive circuit used for driving effective pixels or a processing circuit such as an analog-to-digital conversion circuit (ADC) that processes a signal output from the effective pixel. The peripheral region 14 is located between the peripheral circuit region 13 and the effective pixel region 11 and may include a non-effective pixel region 12 provided with a non-effective pixel. A non-effective pixel is a dummy pixel, a reference pixel, a test pixel, a monitor pixel, or the like that does not function as an effective pixel.

The light transmission plate 90 illustrated in FIG. 1A is arranged to face the effective pixel region 11 and the peripheral region 14. The joining member 80 is arranged between the light transmission plate 90 and the peripheral region 14 of the semiconductor device 100, and the light transmission plate 90 joins the joining member 80 to the semiconductor device 100. The color filter layer 70 illustrated in FIG. 1A is arranged between the light transmission plate 90 and the effective pixel region 11 and between the light transmission plate 90 and the peripheral region 14.

FIG. 1B illustrates an effective pixel portion 71, which is a portion arranged between the light transmission plate 90 and the effective pixel region 11, out of the color filter layer 70. FIG. 1B illustrates a non-effective pixel portion 72, which is a portion arranged between the light transmission plate 90 and the non-effective pixel region 12, out of the color filter layer 70. FIG. 1B illustrates a peripheral circuit portion 73, which is a portion arranged between the light transmission plate 90 and the peripheral circuit region 13, out of the color filter layer 70. The non-effective pixel portion 72 is located between the effective pixel portion 71 and the peripheral circuit portion 73.

FIG. 1B illustrates an outer edge 75 of the color filter layer 70. The outer edge 75 has a quadrangle, and the outer edge 75 has a lower side 76 and a right side 77 as a portion thereof. Although the outer edge 75 has an upper side and a left side as a portion thereof, the references for these portions are omitted in FIG. 1B. The peripheral region 14 includes a non-arrangement region 74 on which the color filter layer 70 is not arranged. The outer edge 75 of the color filter layer 70 matches the inner edge of the non-arrangement region 74.

As can be seen from FIG. 1B, in a plan view with respect to the primary face of the semiconductor device 100, at least a part (the entire circumference in the present example) of the outer edge 75 of the color filter layer 70 is located between the effective pixel region 11 and the joining member 80. With respect to this feature, a cross section taken along a line A-A illustrated in FIG. 1B will be described by using a sectional view illustrated in FIG. 2A, and a cross section taken along a line B-B illustrated in FIG. 1B will be described by using a sectional view illustrated in FIG. 2B. The semiconductor device 100 includes the semiconductor substrate 10, and a face on which a transistor is provided out of the front face and the rear face of the semiconductor substrate 10 is defined as a primary face 1.

Since the lower side 76 and the right side 77 are located between the effective pixel region 11 and the joining member 80, the color filter layer 70 is not located between the joining member 80 and the semiconductor device 100 near the lower side 76 and the right side 77. Obviously, the color filter layer 70 is not located between the joining member 80 and the light transmission plate 90 either. Thereby, an advantageous effect is obtained compared to a case where the color filter layer 70 is located between the joining member 80 and the semiconductor device 100 or between the joining member 80 and the light transmission plate 90. The advantageous effect is that the joining strength between the joining member 80 and the light transmission plate 90 can be improved, and the joining reliability can be improved.

Figure 2A:
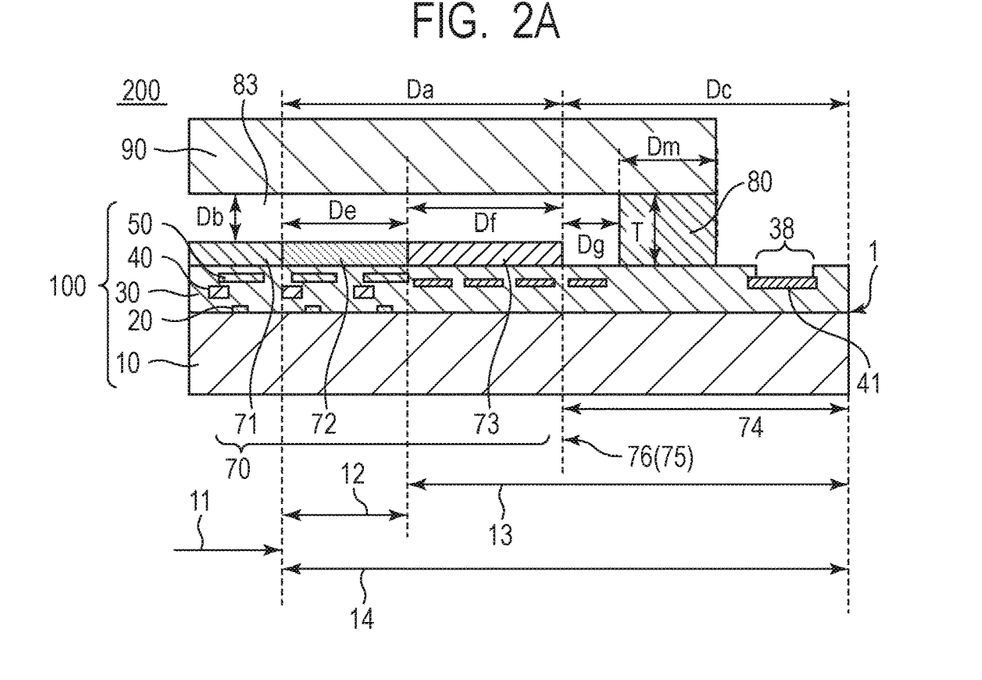
FIG. 2A is a schematic diagram illustrating the semiconductor apparatus according to an embodiment of the present disclosure.
Figure 2B:
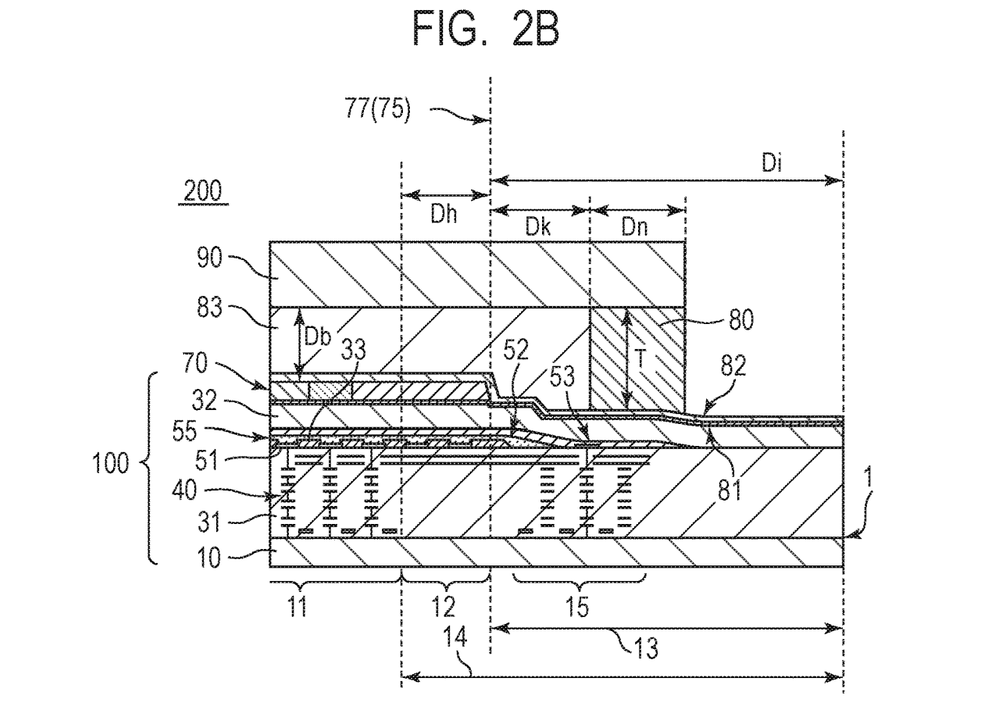
FIG. 2B is another schematic diagram illustrating the semiconductor apparatus according to an embodiment of the present disclosure.

If no color filter layer 70 is arranged in the peripheral region 14, since a light reflects at the peripheral region 14 or a light enters the peripheral region 14, image quality may decrease. Accordingly, the color filter layer 70 is provided in a certain range from the effective pixel region 11. As a result, the outer edge 75 is located outside the effective pixel region 11. Specifically, a distance Da from the effective pixel region 11 to the lower side 76 is greater than a distance Db from the color filter layer 70 (the effective pixel unit 71) to the light transmission plate 90 in the effective pixel region 11. Similarly, a distance Dh from the effective pixel region 11 to the right side 77 is greater than a distance Db from the color filter layer 70 (the effective pixel unit 71) to the light transmission plate 90 in the effective pixel region 11.

As a typical model, it is assumed that a light exiting at an angle of 45 degrees relative to the primary face 1 from the end of the effective pixel region 11 is reflected at the light transmission plate 90 and enters the peripheral region 14. The incidence position to the peripheral region 14 is a position that is twice the distance Db away from the end of the effective pixel region 11. It is therefore preferable that the distance Da and the distance Dh be greater than or equal to twice the distance Db. The distance Da and the distance Dh may be greater than or equal to 10 times the distance Db or may be greater than or equal to 100 times the distance Db. The distance Da and the distance Dh are greater than or equal to 100 μm, for example, smaller than or equal to 1000 μm, for example, or equal to 700 μm, for example. The distance Db is controlled by a thickness T of the joining member 80. It is preferable to set the thickness T to be thicker than the thickness of the color filter layer 70. The distance Db may be greater than the distance between the joining member 80 and the light transmission plate 90 (zero in the present example), and the distance Db may be greater than the thickness of the entire color filter layer 70.

As illustrated in the present embodiment, by separating the color filter layer 70 from the light transmission plate 90 (Db>0) and arranging the light transmission plate 90 closer to the effective pixel region 11, it is possible to reduce visible resolution or crosstalk due to a spread of light. The thickness of the color filter layer 70 is 0.5 to 1.5 μm, for example. The distance Db is greater than or equal to 1 μm, for example, smaller than or equal to 50 μm, for example, smaller than or equal to 10 μm, for example, or equal to 3 μm, for example. When the distance Da and the distance Dh are excessively increased, the area of the entire semiconductor apparatus 200 increases. Accordingly, the distance Da may be smaller than the distance Dc from the lower side 76 to the end of the semiconductor device 100. Similarly, the distance Dh may be smaller than the distance Di from the right side 77 to the end of the semiconductor device 100. The distance Dc and the distance Di may be greater than or equal to 500 μm, for example, or smaller than or equal to 1 mm, for example, and the distance is preferably smaller than or equal to 5 mm, for example.

In the example of FIG. 2A, while the distance Da is greater than a distance Dg from the lower side 76 to the joining member 80, the distance Da may be smaller than the distance Dg from the lower side 76 to the joining member 80. The distance Dg is greater than or equal to 500 μm, for example, smaller than or equal to 2000 μm, for example, or equal to 1000 μm, for example.

In the example of FIG. 2B, while the distance Dh is smaller than a distance Dk from the right side 77 to the joining member 80, the distance Dh may be greater than the distance Dk from the right side 77 to the joining member 80. The distance Dk is greater than or equal to 500 μm, for example, smaller than or equal to 2000 μm, for example, or equal to 1000 μm, for example.

With respect to the widths Dm and Dn of the joining member 80, Dm<Dc−Dg, and Dn≤Di−Dk. The widths Dm and Dn are wider than or equal to 500 μm, for example, narrower than or equal to 2000 μm, for example, or equal to 1000 μm, for example. While the distance Dc−Dg−Dm corresponds to the width of the semiconductor device 100 outside the joining member 80, since the external connection terminal 41 is arranged at the lower side 76, the distance Dc−Dg−Dm is greater than or equal to 500 μm, for example, smaller than or equal to 5000 μm, for example, or equal to 1500 μm, for example. When Dn=Di−Dk, the outer side face of the joining member 80 matches the end of the semiconductor device 100. In other words, Di−Dk−Dn=0. Since no external connection terminal 41 is arranged near the right side, the left side, and the upper side other than the lower side 76, the outer side face of the joining member 80 or the outer side face of the light transmission plate 90 may match the end of the semiconductor device 100.

As described above, in the present embodiment, when Dg>0 and Da>Db are both satisfied in at least a part of the outer edge 75, both improvement of the joining strength and improvement of the image quality can be realized near such a part of the outer edge 75. While each of the lower side 76 and the right side 77 of the joining member 80 of a quadrangle is applied to a part of the outer edge 75 in the description above, application is not limited thereto. For example, even in a form in which the condition described above is satisfied at a part of one side of the joining member 80 of a quadrangle (for example, the center part) and is not satisfied at a part of another side of the joining member 80 of the quadrangle (for example, the peripheral part), improvement of the joining strength and improvement of the image quality can be realized in the center portion. Even when a portion which does not satisfy the relationship described above for a reason of design or manufacturing is present in a part of the outer edge 75, such a form is also included in the scope of the present embodiment.

However, it may be preferable to satisfy relationships Dg>0 and Da>Db in most part of the outer edge 75 (50% or more). To summarize an example of the relationship of respective dimensions described above, the relationship Db≤T<100 μm<Df≤De<Da<Dm≤Dg≤1000 μm<Dc−Dg−Dm<Dc may be satisfied near the lower side 76. The relationship Di−Dk−Dn<Db≤T<100 m<Dh<Dn≤Dk≤1000 μm<Di may be satisfied near the right side 77.

The detail of the color filter layer 70 will be described. The effective pixel portion 71 of the color filter layer 70 is formed such that polychrome color filters are arranged in an array. The colors of the color filter layer are red (R), green (G), and blue (B), and may be cyan, magenta, yellow, or the like. The arrangement of the color filters for each color may be stripe arrangement, delta arrangement, Bayer arrangement, or the like, and the Bayer arrangement is used in the present example. Further, the color filter layer 70 on the peripheral region 14 has a multiple-color (polychrome) portion that is a portion in which polychrome color filters are arranged in an array.

The color filter layer 70 on the peripheral region 14 has a single-color (monochrome) portion that is a portion in which monochrome color filter extend. In this example, the width of the monochrome color filter in the single-color portion is wider than the width of the monochrome color filter in the effective pixel portion 71 (that is, the width of one pixel). Further, the width of the monochrome color filter in the single-color portion is wider than the width of the monochrome color filter in the multiple-color portion. The width of the monochrome color filter in the single-color portion is preferably wider than the distance Da. The width of the single-color portion is wider than or equal to 10 μm, for example, wider than or equal to 100 μm, for example, or narrower than or equal to 1000 μm, for example. Further, the multiple-color portion is located between the single-color portion and the effective pixel portion 71.

In the present example, while the non-effective pixel portion 72 is the multiple-color portion and the peripheral circuit portion 73 is a single-color portion, the multiple-color portion and the single-color portion may be separately arranged regardless of the configuration of the peripheral region 14. With respect to the color of the single-color portion, it is preferable to use a color filter having the shortest absorption wavelength of visible light out of the polychrome color filters included in the color filter layer 70. Out of red (R), green (G), blue (B), cyan, magenta, and yellow, it is preferable to use a blue filter for the single-color portion. Although the outer edge 75 can be formed of a multiple-color portion, in terms of controlling the color of a stray light generated in the peripheral region 14, the outer edge 75 is preferably formed of a single-color portion. At least a part of the outer edge 75 is preferably formed of a blue color filter, and in the present example, the entire circumference of the outer edge 75 is formed of a single-color portion formed of a blue color filter.

The more detailed configuration of the semiconductor apparatus 200 will be described by using FIG. 2A and FIG. 2B. As illustrated in FIG. 2A, the semiconductor device 100 has the semiconductor substrate 10, a wiring structure 40, and an insulating member 30.

The semiconductor substrate 10 is made of a semiconductor such as a mono-crystal silicon. A semiconductor element 20 is a transistor or a diode, and at least a part thereof is provided in the semiconductor substrate 10. The wiring structure 40 includes a multilayered wiring layer such as an aluminum layer or a copper layer, a via plug, or a contact plug. The insulating member 30 illustrated in FIG. 2A includes an insulating film 31 or a passivation film 32 formed of a plurality of interlayer insulating layers illustrated in FIG. 2B. The insulating film 31 is made of a silicon oxide layer, a silicon nitride layer, a silicon carbide layer, or the like, and the passivation film 32 is made of a silicon nitride layer, a silicon oxide layer, or the like. Note that, since nitrogen and silicon are used as the primary elements, silicon oxynitride and silicon carbonitride are regarded as a type of silicon nitride.

As illustrated in FIG. 2A, a function element 50 is provided in the effective pixel region 11 of the semiconductor device 100. When the semiconductor apparatus 200 is a display apparatus, the function element 50 is a display element. The display element is an EL element in an electroluminescence display (ELD), a liquid crystal element in a liquid crystal display (LCD), or a reflection element in a digital mirror device (DMD). When the semiconductor apparatus 200 is an imaging apparatus, the function element 50 is a photoelectric conversion element.

FIG. 2B illustrates the function element 50 in more detail. A plurality of pixel electrodes 51, an opposite electrode 52 facing the plurality of pixel electrodes 51, and a function layer 55 provided between the plurality of pixel electrodes 51 and the opposite electrode 52 are provided in the effective pixel region 11. The insulating member 30 may include an isolation portion 33 (also referred to as a bank) arranged between the plurality of pixel electrodes 51.

The function element 50 illustrated in FIG. 2A includes the pixel electrode 51, the function layer 55, and the opposite electrode 52, as illustrated in FIG. 2B. The function layer 55 in an organic EL element is an organic light emitting layer, and in an EL element, the pixel electrode 51 functions as the anode (a positive electrode) and the opposite electrode 52 functions as the cathode (a negative electrode). The function layer 55 in a photoelectric conversion element is a photoelectric conversion layer. At least a part of the function element 50 may be arranged inside the semiconductor substrate 10, and the function element 50 may be a photodiode arranged inside the semiconductor substrate 10, for example.

As illustrated in FIG. 2B, the outer edge 75 (the right side 77) of the color filter layer 70 overlaps the opposite electrode 52. In other words, the opposite electrode 52 extends to the outside of the outer edge 75 of the color filter layer 70 (on the end side of the semiconductor substrate 10).

The wiring structure 40 is provided between the plurality of pixel electrodes 51 and the semiconductor substrate 10. A wiring of the wiring structure 40 is appropriately connected to the pixel electrode 51 and the opposite electrode 52, respectively. The opposite electrode 52 has a contact portion with the wiring structure 40, and the wiring structure 40 has a contact portion with the opposite electrode 52, which are collectively referred to as a cathode contact 53. As illustrated in FIG. 1B, the outer edge 75 (the right side 77) of the color filter layer 70 is located between the cathode contact 53 and the effective pixel region 11 in a plan view.

As illustrated in FIG. 2B, the passivation film 32 covers the function element 50 (the opposite electrode 52, the function layer 55, or the pixel electrodes 51), the wiring structure 40, the insulating member 30, and the semiconductor substrate 10. For convenience, the passivation film 32, the semiconductor substrate 10, and a structure arranged between the passivation film 32 and the semiconductor substrate 10 are referred to as the semiconductor device 100.

The color filter layer 70 is provided on the semiconductor device 100 via a resin layer 81. A resin layer 82 is provided on the color filter layer 70. In other words, the color filter layer 70 is located between the resin layer 81 and the resin layer 82.

The resin layer 81 functions as an adhesive layer, and the resin layer 82 functions as a planarization layer. The resin layer 82 is arranged on the effective pixel region 11 and the peripheral region 14. The color filter layer 70 is located between the resin layer 82 and the semiconductor device 100. The joining member 80 is provided between the resin layers 81 and 82 and the light transmission plate 90. That is, the resin layer 81 and the resin layer 82 extend between the joining member 80 and the semiconductor device 100.

The joining member 80 may include a matrix made of a resin and a filler made of a resin distributed in the matrix. The median of the particle diameter of the filler is 2 to 50 μm. The matrix resin of the joining member 80 contacts with both the semiconductor device 100 and the light transmission plate 90. As another example of the joining member 80, the joining member 80 can also be formed of a base occupying a most part of the thickness of the joining member 80, an adhesive layer that adheres the base to the semiconductor device 100, and an adhesive layer that adheres the base to the light transmission plate 90.

The light transmission member 83 is provided between the color filter layer 70 and the light transmission plate 90 and contacts with the light transmission plate 90. The light transmission member 83 fills the space between the light transmission plate 90 and the color filter layer 70. The light transmission member 83 is made of a resin, for example. The light transmission member 83 may be formed of a material having a refractive index lower than that of the light transmission plate 90.

As illustrated in FIG. 2A, the semiconductor device 100 has the external connection terminal 41 (also referred to as a pad) used for an electrical connection with the flexible circuit board 300 connected to the semiconductor device 100 as illustrated in FIG. 1A. The external connection terminal 41 may be formed of a wiring layer included in the wiring structure 40. In a plan view with respect to the primary face 1 of the semiconductor device 100, the joining member 80 is located between the external connection terminal 41 and the lower side 76 that is a part of the outer edge 75.

A manufacturing method of an organic EL display apparatus that is an example of the embodiment will be described by using FIG. 2A and FIG. 2B. As illustrated in FIG. 2A and FIG. 2B, the organic EL display apparatus according to the present embodiment includes the semiconductor substrate 10.

For example, silicon may be used for the semiconductor substrate 10. The semiconductor element 20 such as a transistor is provided on the primary face 1 that is a surface of the semiconductor substrate 10. The insulating member 30 is provided on the semiconductor element 20 and the primary face 1 of the semiconductor substrate 10. Silicon oxide, Silicon nitride, or the like is used for the insulating member 30. A contact plug (not illustrated) electrically connected to the semiconductor element 20 is arranged to the insulating member 30. A conductive member such as tungsten is embedded in the contact plug. The wiring structure 40 electrically connected to the semiconductor element 20 via the contact plug is provided inside the insulating member 30. A metal member such as aluminum or copper is used for the wiring structure 40, and a barrier metal such as titanium (Ti), tantalum (Ta), titanium nitride (TiN), tantalum nitride (TaN), or the like may be provided at the interface between the insulating layer and the wiring structure 40 to suppress metal diffusion into the insulating layer.

While the external connection terminal 41 or the ground wiring (not illustrated) is provided on the same layer as the wiring structure 40 in the peripheral circuit region 13 of the semiconductor substrate 10, the insulating member 30 on the external connection terminal 41 is removed to expose the external connection terminal 41 from an opening 38 of the insulating member 30. Further, as described below, also for the ground wiring, the insulating member 30 on the ground wiring is opened in order to be connected to the opposite electrode 52 forming the organic EL element.

The function element 50 is provided as the organic EL element on the insulating member 30 in the effective pixel region 11. The function element 50 is formed of at least the pixel electrode 51 electrically connected to the wiring structure 40 via a through hole, the function layer 55 as an organic emitting layer, and the opposite electrode 52.

The pixel electrodes 51 are arranged separately on a pixel basis by the isolation portion 33 and also function as the pixel electrode 51. To suppress a short circuit between the pixel electrode 51 and the opposite electrode 52, it is preferable to employ the structure in which the end of the pixel electrode 51 is covered with the isolation portion 33 (the bank) formed of an insulating layer between the pixel electrodes 51. To facilitate injection and transportation of holes from the pixel electrode 51, it is preferable to form a hole injection layer or a hole transportation layer between the organic light emitting layer and the pixel electrode 51.

Further, to facilitate injection and transportation of electrons from the opposite electrode 52, it is preferable to form an electron transportation layer or an electron injection layer between the organic light emitting layer and the opposite electrode 52. The stacking structure of the pixel electrode 51/the hole injection layer/the hole transportation layer/the organic light emitting layer/the electron transportation layer/the electron injection layer/the opposite electrode 52 is used here. The function layer 55 is made of the hole injection layer/the hole transportation layer/the organic light emitting layer/the electron transportation layer/the electron injection layer.

The opposite electrode 52 is an electrode common to all the pixels and is arranged to extend to the peripheral circuit region 13 and connected to the ground wiring described above. Each of the ground wiring of the wiring structure 40 and the opposite electrode 52 includes a contact portion referred to as the cathode contact 53 used for a connection with each other.

While the organic light emitting layer or the opposite electrode 52 is formed on the entire surface of the effective pixel region 11 by deposition or spattering using a metal mask, since a gap is generated between the metal mask and the semiconductor substrate 10, a wrapping occurs outside the metal mask opening. Since the wrapping of the organic light emitting layer is greater than or equal to 0.2 mm, it is preferable to provide the position of the cathode contact 53 outside the end of the effective pixel region 11 by at least 0.2 mm or greater. The width of the cathode contact 53 is greater than or equal to 50 μm, for example, smaller than or equal to 500 μm, for example, or 100 to 200 μm, for example.

Subsequently, before the peripheral circuit portion 73 of the color filter layer 70 described below is formed, the resin layer 81 used for planarization can be formed to reduce a step between the pixels of the organic EL element. Further, the sealing passivation film 32 used for suppressing moisture penetration can be formed on the organic EL element. The lens structure for increasing the light extraction efficiency may be separately provided on the passivation film 32.

Next, the effective pixel portion 71 of the color filter layer 70 is provided on the function element 50 (the organic EL element) in the effective pixel region 11. The effective pixel portion 71 of the color filter layer 70 is formed of color filters of three colors of red, green, and blue, which are arranged in the Bayer arrangement, for example. The peripheral circuit region 13 in which the peripheral circuit is mainly arranged is provided outside the effective pixel region 11, and the peripheral circuit portion 73 of the color filter layer 70 is provided on the insulating member 30 in the peripheral circuit region 13.

The peripheral circuit portion 73 of the color filter layer 70 may employ three-color parallel arrangement of red, green, and blue as with the effective pixel unit 71 of the color filter layer 70, three-color stacking structure to improve light shielding, or single-color arrangement of any color.

With the single-color arrangement, in application where the background outside the display region (the effective pixel region 11) is black as with the organic EL display apparatus, it is preferable that the peripheral circuit portion 73 of the color filter layer 70 be blue because of the least visibility. While the peripheral circuit portion 73 of the color filter layer 70 is not required to be arranged in the Bayer arrangement as with the color filter layer and can be arranged in any pattern, no peripheral circuit portion 73 is arranged in a forming region of the joining member 80 formed in a subsequent process.

Further, since a portion near the cathode contact 53 described above has large unevenness, it is preferable to arrange the color filter layer 70 inside the cathode contact 53 and not to provide the color filter layer 70 on the cathode contact 53. The distance between the cathode contact 53 and the outer edge 75 (the right side 77) is preferably greater than the thickness of the color filter layer 70 and is preferably greater than the distance Db but may be smaller than the width of the cathode contact 53.

The distance between the cathode contact 53 and the outer edge 75 (the right side 77) is greater than or equal to 10 μm, for example, smaller than or equal to 100 μm, for example, or equal to 50 μm, for example. The distance between the cathode contact 53 and the outer edge 75 may be smaller than the distance between the cathode contact 53 and the joining member 80. The distance between the cathode contact 53 and the joining member 80 is greater than or equal to 200 μm, for example, smaller than or equal to 2000 μm, for example, or 500 to 1000 μm, for example. It is therefore preferable to arrange the outer end of the opposite electrode 52 outside the outer edge 75 of the color filter layer 70.

As a result, the outer edge 75 of the color filter layer 70 overlaps the opposite electrode 52. The opposite electrode 52 overlaps the joining member 80 in the present example. Since the joining member 80 extends in the horizontal direction when the light transmission plate 90 is attached, it is necessary to provide the non-arrangement region 74 in which the color filter layer 70 is not arranged so that the joining member 80 that extends accordingly does not come into contact with the color filter layer 70.

Note that, while the color filter layer 70 is arranged only inside the joining member 80 in the present implementation, the color filter layer 70 may be arranged on each of the inside and the outside of the joining member 80 as long as no color filter layer 70 is arranged directly under the joining member 80. As illustrated in FIG. 1B, the widths of the color filter layer 70 arranged in the peripheral region 14 are denoted as the distance Da or the distance Dh. For the purpose of surface protection or planarization of the color filter layer, a transparent resin layer 82 may be formed on the effective pixel portion 71 of the color filter layer 70 and the peripheral circuit unit 73 of the color filter layer 70.

Next, a resin material used as the joining member 80 is formed by a method such as dispensing, screen printing, or the like in a region except the peripheral circuit unit 73 or the external connection terminal 41 of the color filter layer 70 in the peripheral circuit region 13 of the semiconductor substrate 10. After the light transmission plate 90 is attached to the semiconductor substrate 10, the resin material is cured to form the joining member 80.

As illustrated in FIG. 1B, the gap between the semiconductor substrate 10 and the light transmission plate 90 is the thickness T of the cured joining member 80. As the joining member 80, any resin of an epoxy, an acryl, a urethane, an polyimide, or the like used as a UV curable resin, a thermosetting resin, a two-component mixed resin, or the like can be used, and it is preferable that a filler be appropriately contained in the resin. It is preferable that a filler be contained, because the gap between the semiconductor substrate 10 and the light transmission plate 90 can be controlled by the thickness of the joining member 80 due to the size of the filler when the semiconductor substrate 10 and the light transmission plate 90 are attached to each other.

Further, while any filler such as glass beads, resin beads, or the like can be used for the filler, it is preferable to use resin beads that are less likely to damage the insulating layer or a sealing layer (if a sealing layer is formed) on the semiconductor substrate 10. Since the joining member 80 is arranged in the non-arrangement region 74 in which the color filter layer 70 is absent, it is desirable to set the thickness of the joining member 80 to be thicker than the thickness of the color filter layer 70. Since the thickness of the color filer layer 70 is around 0.5 to 1.5 µm, for example, the thickness of the joining member 80 is desirably thicker than or equal to 2 µm, and 50 µm at the maximum is sufficient.

To improve the light shielding efficiency of the peripheral region 14, it can be considered that the color filter layer 70 is formed to the end of the semiconductor substrate 10, and the joining member 80 is formed on the color filter layer 70 to attach the light transmission plate 90. However, the color filter layer 70 contains a pigment, and adhesiveness between the color filter layer 70 and a base layer is low. Thus, there is a problem of interlayer delamination at the interface between the color filter layer 70 and the joining member 80 or at the interface between the color filter layer 70 and the base layer.

Such interlayer delamination may occur due to curing and shrinkage of a resin occurring when at the joining member 80 is formed or due to expansion and shrinkage occurring when the semiconductor apparatus is exposed to a high temperature and high humidity environment or the like. As described above, in the present embodiment, the color filter layer 70 is not arranged in a region in which the joining member 80 is arranged, and the joining member 80 is adhered to the insulating member 30 on the primary face 1 of the semiconductor substrate 10. By not providing the color filter layer 70 under the joining member 80, it is possible to suppress interlayer delamination between the joining member 80 and the color filter layer 70 due to volume shrinkage occurring when the joining member 80 is cured.

Further, by not providing the color filter layer 70 under the joining member 80, it is possible to suppress interlayer delamination between the joining member 80 and the color filter layer 70 due to expansion and shrinkage of the material when exposed to a high temperature and high humidity environment or the like.

Further, interlayer delamination at the interface between the color filter layer 70 and the base layer of the color filter layer 70 can also be suppressed. In particular, the color filter layer 70 containing a pigment has a lower adhesiveness to the adherend than the color filter layer 70 containing a die. Therefore, when the color filter layer 70 contains a pigment, interlayer delamination due to volume shrinkage occurring when the joining member 80 is cured or expansion and shrinkage occurring when the semiconductor apparatus is exposed to a high temperature and high humidity environment or the like is likely to occur. Therefore, when the color filter layer 70 contains a pigment, the present embodiment is preferable. The light transmission plate 90 is not particularly limited as long as the material has high transparency, and a glass or the like may be used.

Note that it is also possible to perform packaging at a wafer level. For example, the semiconductor substrate 10 is prepared as a silicon wafer, a plurality of devices are formed on the silicon wafer, and a color filter layer 70 is formed for each device. The joining member 80 is then formed on the silicon wafer so as to surround each device. A grass wafer used as the light transmission plate 90 is prepared, and the glass wafer is attached to the silicon wafer via the joining member 80. The joined body of the silicon wafer and the glass wafer is then diced on a device basis. A portion of the glass wafer on the top of the external connection terminal 41 may be removed after dicing.

Subsequently, the external connection terminal 41 and an external power source (not illustrated) are connected to each other by using a mounting device (not illustrated) such as a bonding wire, a bump, an anisotropic conductive resin, or the like to complete the organic EL display apparatus of the present disclosure.

Further, in the present implementation, a resin is filled in a region defined by the joining member 80 between the semiconductor substrate 10 and the light transmission plate 90, and the light transmission member 83 is arranged in the structure. In such a case, the joining member 80 is first applied on the semiconductor substrate 10, and after a filling resin is dropped to the inside of the joining member 80, the light transmission plate 90 may be attached. Alternatively, as with a vacuum injection method, a filling resin may be injected from an opening provided in the joining member 80 after the light transmission plate 90 is attached by the joining member 80. Instead of providing the light transmission member 83 in the region defined by the joining member 80 between the semiconductor substrate 10 and the light transmission plate 90, a gas may be sealed to make a hollow.

Here, a thickness relationship between the color filter layer 70 and the joining member 80 in the organic EL display apparatus will be described in detail by using FIG. 3A and FIG. 3B.

Figure 3A:
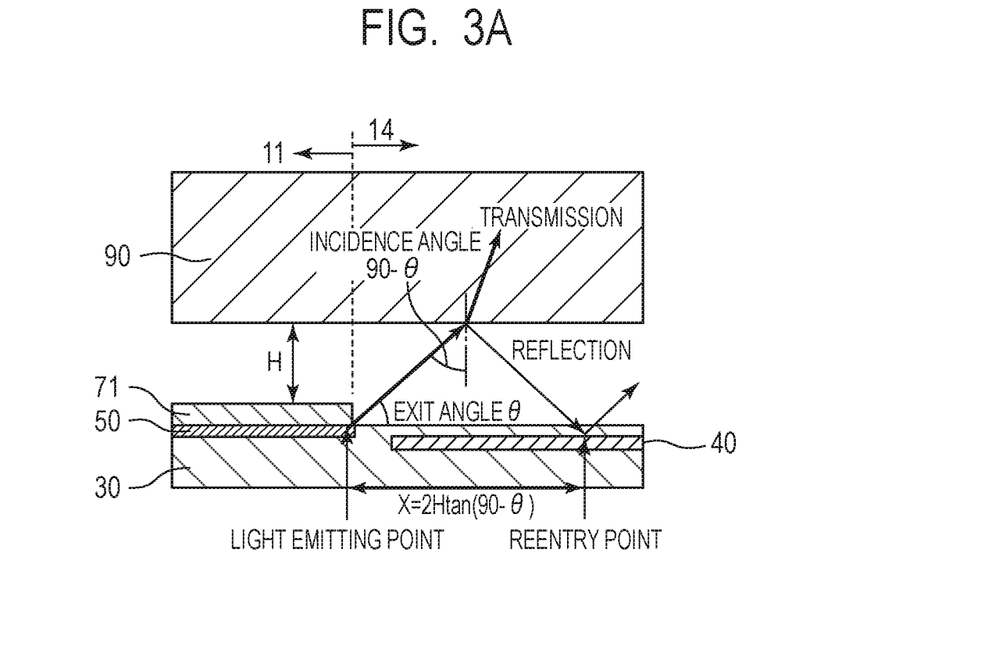
FIG. 3A is a schematic diagram illustrating the semiconductor apparatus according to an embodiment of the present disclosure.

FIG. 3A illustrates a ray diagram of a light exiting the organic EL element of the outmost periphery pixel without the color filter layer 70 in the peripheral region 14. As illustrate in FIG. 3A, a ray exiting the surface of the organic EL element to the air at the exit angle θ travels in the layer of the air and enters the light transmission plate 90 made of a glass at the incidence angle (90−θ) degrees. The position of the light incidence face of the light transmission plate 90 is denoted as a height H when the position of light emission is a reference. The height H corresponds to the distance Db or the thickness T described above. Then, while a most part of a light refracts and transmits inside the light transmission plate 90, a part of the light (for example, approximately 4% when θ=45 degrees) reflects at the air/glass interface. While the reflected light reenters the peripheral circuit region of the semiconductor substrate 10, the distance from the light emitting point to the reentry point is expressed as X=2H tan(90−θ) and depends on the height H of the light transmission plate 90 and the exit angle θ. The light reentering the semiconductor substrate 10 reflects at the wiring portion forming the peripheral circuit and causes a reduction in image quality as the organic EL display apparatus.

Figure 3B:
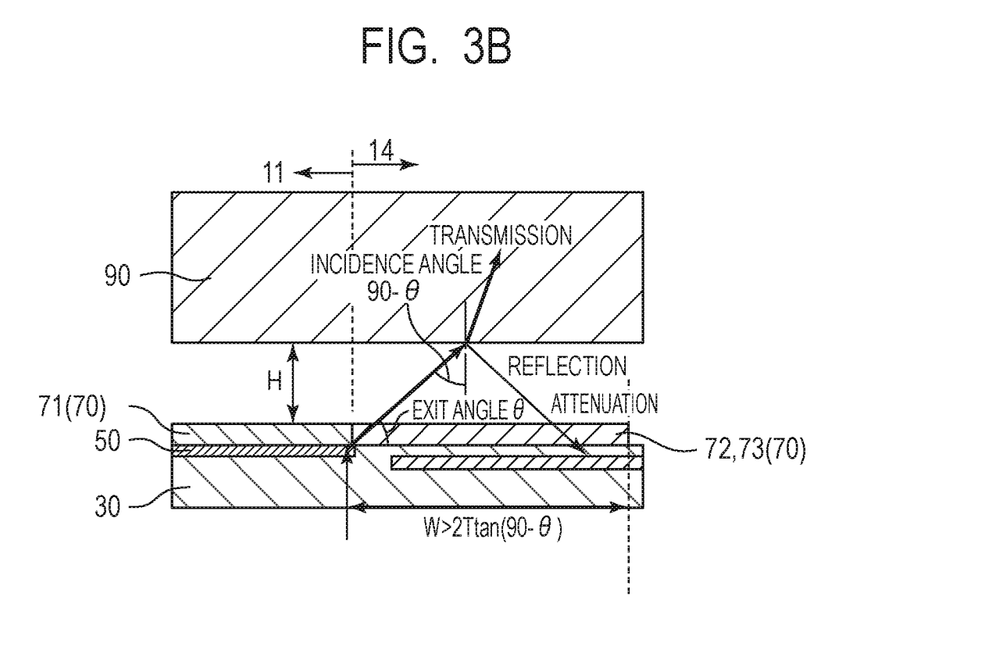
FIG. 3B is another schematic diagram illustrating the semiconductor apparatus according to an embodiment of the present disclosure.

Accordingly, by setting a width W of the color lifter layer 70 in the peripheral region 14 to be greater than or equal to the distance X from the light emitting point to the reentry point as illustrated in FIG. 3B, it is possible to suppress reflection in the peripheral circuit region. Since the distance from the light emitting point to the reentry point increases as the exit angle decreases, it is desirable that the width W of the color filter layer 70 in the peripheral region 14 be wider, but the size as the organic EL display apparatus will increase.

With respect to an exit angle distribution on the light emission intensity of the organic EL element, the intensity is the highest in the normal direction of a first primary face of the semiconductor substrate 10 (the exit angle 90 degrees in FIG. 3A), and the light emission intensity decreases as the exit angle decreases from 90 degrees. Since the ratio of light emission at the exit angle greater than or equal to 60 degrees is considerably large compared to light emission at the exit angle smaller than 60 degrees, the width W that can suppress influence due to reflection only for the light emission at the exit angle greater than or equal to 60 degrees may be set. With the exit angle at 60 degrees, $X=1.1$ H, and it is appreciated that it is preferable to substantially satisfy the relationship of $W>H$.

As described above, the width W of the color filter layer 70 in the peripheral region 14 may be set to have $W>2H \tan(90-\theta)$ with the exit angle to be considered being appropriately set, and in the case of the organic EL element, the relationship of $W>H$ is derived. With $H=T$, $W>2T \tan(90-\theta)$ is resulted as described in FIG. 3B.

As described above, by setting the width of the color filter layer 70 in the peripheral region 14 to be greater than or equal to the distance Db or the thickness T of the joining member 80, it is possible to suppress reflection in the peripheral circuit region and improve the image quality as the organic EL display apparatus. Further, by not arranging the color filter layer 70 in the peripheral region 14 under the joining member 80, interlayer delamination between the joining member 80 and the color filter layer 70 in the peripheral region 14 is suppressed, and the yield and the environmental reliability can be improved.

Figure 4:
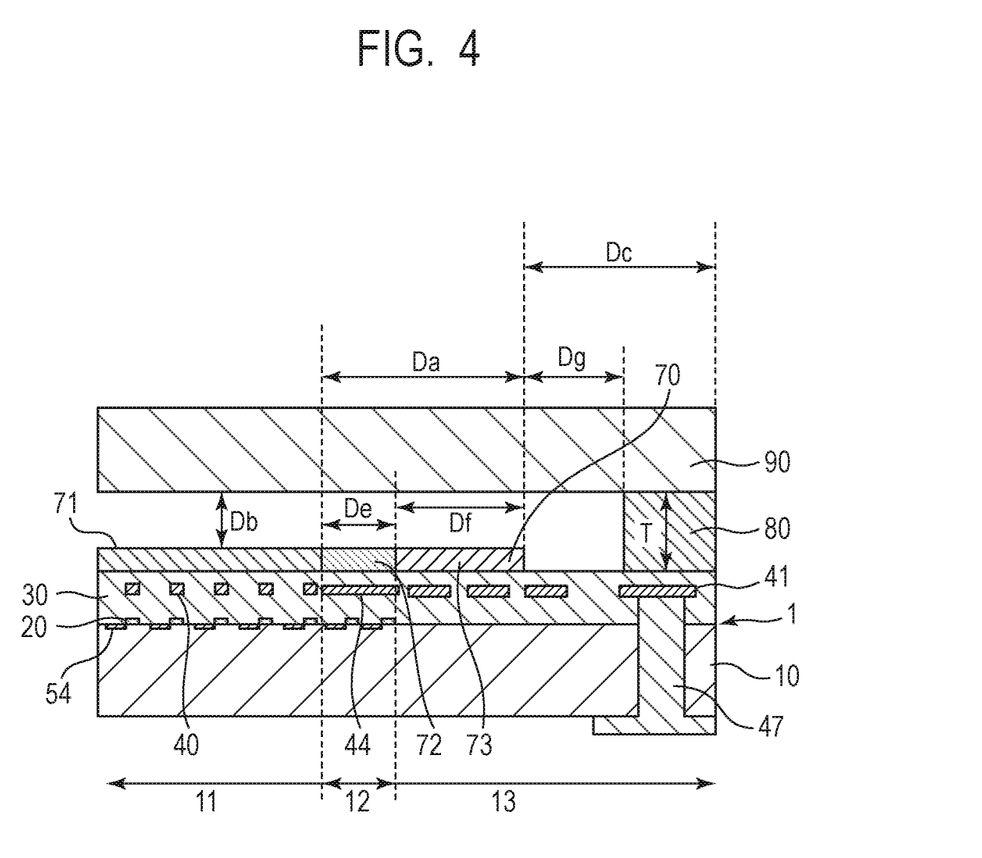
FIG. 4 is a schematic diagram illustrating the semiconductor apparatus according to an embodiment of the present disclosure.

The embodiment illustrated in FIG. 4 is an example of application to an imaging apparatus. As the semiconductor substrate 10, silicon may be used, for example. The semiconductor element 20 such as a transistor and a photodiode PD are provided on the primary face 1 that is one of the surfaces of the semiconductor substrate 10. The insulating member 30 is provided on the semiconductor element 20, a photodiode 54, and the primary face 1 of the semiconductor substrate 10. For the insulating member 30, silicon oxide, silicon nitride, or the like is used. A contact plug (not illustrated) electrically connected to the semiconductor element 20 is arranged in the insulating member 30. A conductive member such as tungsten is embedded in the contact plug. The wiring structure 40 electrically connected to the semiconductor element 20 via the contact plug is provided inside the insulating member 30.

As illustrated in FIG. 4, the outside of the effective pixel region 11 is provided with the non-effective pixel region 12 that is an optical-black (OB) pixel used for dark current correction, and the non-effective pixel region 12 is provided with an OB light-shielding film 44 on the same level as the wiring structure 40. The peripheral circuit region 13 that is more outside the non-effective pixel region 12 is provided with the external connection terminal 41 on the same level as the wiring structure 40.

A metal material such as aluminum, copper, or the like is used for the wiring structure 40, the OB light-shielding film 44, and the external connection terminal 41, and a barrier metal such as Ti, Ta, TiN, TaN, or the like may be provided at the interface between the insulating layer and the wiring structure 40 to suppress metal diffusion into the insulating layer. Next, the effective pixel portion 71 of the color filter layer 70 is provided on the insulating member 30 in the effective pixel region 11, and the non-effective pixel portion 72 and the peripheral circuit unit 73 of the color filter layer 70 are provided on the insulating member 30 in the non-effective pixel region 12 and the peripheral circuit region 13.

The non-effective pixel portion 72 and the peripheral circuit unit 73 of the color filter layer 70 are formed in the same manner as the embodiment of FIG. 2A and FIG. 2B, and the color filter layer 70 is not arranged in a formation region of the joining member 80 formed in a subsequent process. As illustrated in FIG. 4, the width of the peripheral circuit portion 73 of the color filter layer 70 is denoted as Df. The width of the peripheral circuit portion 73 of the color filter layer 70 will be described in detail below. Although not illustrated, for the purpose of surface protection or planarization of the color filter layer, a transparent resin layer may be separately formed on the effective pixel portion 71 of the color filter layer 70 and the peripheral circuit unit 73 of the color filter layer 70.

Next, in the same manner as the embodiment of FIG. 2A and FIG. 2B, the light transmission plate 90 is attached to the semiconductor substrate 10 via the joining member 80. The same material and the same manufacturing method as in the embodiment can be used. As illustrated in FIG. 4, the gap between the semiconductor substrate 10 and the light transmission plate 90 corresponds to the thickness T of the joining member 80. The thickness of the joining member 80 is also the same as that of the embodiment.

As described above, in the present disclosure, the peripheral circuit portion 73 of the color filter layer 70 is not arranged in the region in which the joining member 80 is arranged, and the joining member 80 is adhered to the insulating member 30 on the primary face 1 of the semiconductor substrate 10. By not providing the color filter layer 70 under the joining member 80, it is possible to suppress interlayer delamination between the joining member 80 and the color filter layer 70 due to volume shrinkage occurring when the joining member 80 is cured or expansion and shrinkage of a material occurring when the material is exposed to a high temperature and high humidity environment or the like. The light transmission plate 90 is not particularly limited as long as the material has high transparency, and a glass or the like may be used.

Subsequently, a via extending from the rear face of the semiconductor substrate 10 to the wiring structure 40 is formed, and a through electrode 47 that is a conductive member such as copper embedded inside the via is provided. The through electrode 47 is an electrode that penetrates the semiconductor substrate 10 included in the semiconductor device 100. Further, by connecting the through electrode 47 and the external power source to each other by using a mounting device such as a bonding wire, a bump, an anisotropic conductive resin, or the like, the imaging apparatus of the present disclosure is completed. By connecting to an external power source from the rear face of the semiconductor substrate 10 by a through electrode TSV as in the present embodiment, it is possible to reduce the size of the imaging apparatus.

The thickness relationship between the peripheral circuit portion 73 of the color filter layer 70 and the joining member 80 in an imaging apparatus will now be described in detail by using FIG. 5A and FIG. 5B.

Figure 5A:
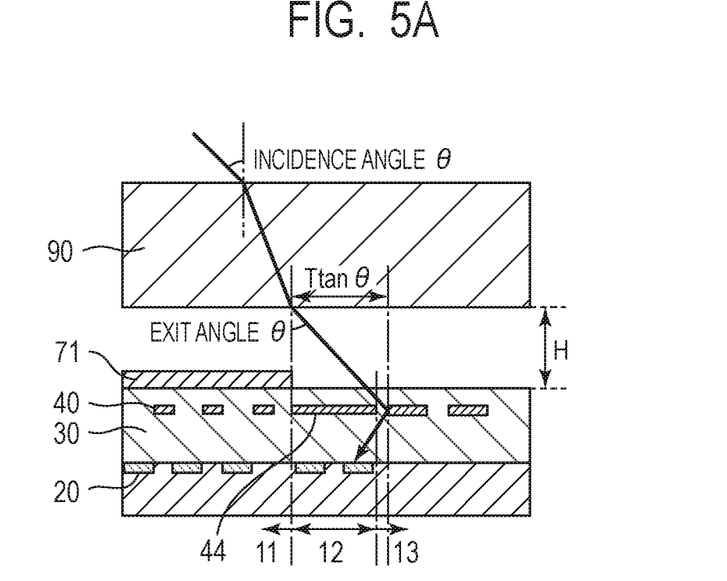
FIG. 5A is a schematic diagram illustrating the semiconductor apparatus according to an embodiment of the present disclosure.
Figure 5B:
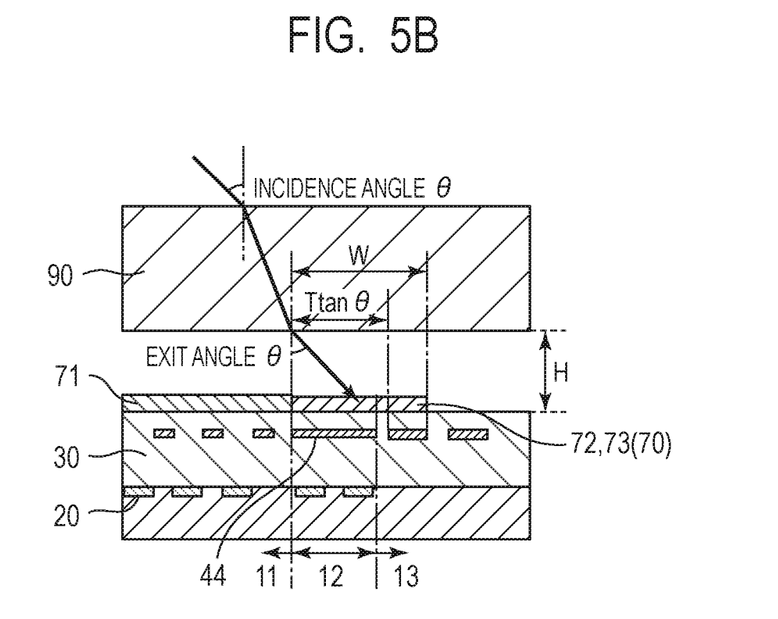
FIG. 5B is another schematic diagram illustrating the semiconductor apparatus according to an embodiment of the present disclosure.

FIG. 5A illustrates a ray diagram of an external light entering the light transmission plate 90 without the peripheral circuit 73 of the color filter layer 70. As illustrate in FIG. 5A, a ray emitting to the light transmission plate 90 at the incidence angle θ exits the light transmission plate 90 at the exit angle θ. While the height H is here approximated by the thickness T, the height H may be approximated by the distance Db.

In the semiconductor device, the exited light reaches a position that is H×tan θ=T×tan θ away from the light exiting point, enters the peripheral circuit region 13, for example, and irregularly reflects at the side face of the wiring structure 40 or the like. When a part of the irregularly reflected light enters the photodiode PD of the non-effective pixel region 12, the dark current increases, and the image quality decreases. Obviously, the problem described above can be solved by forming the OB light-shielding film 44 to extend to the outside, however, this requires the peripheral circuit region 13 to be arranged outside and causes a problem of an increase in size of the apparatus.

In the present disclosure, the peripheral circuit portion 73 of the color filter layer 70 can suppress the external light from entering the OB pixel, and the width W of the peripheral circuit portion 73 of the color filter layer 70 may be set as W>H×tan θ=T×tan θ. As the incidence angle from the air to the light transmission plate 90 increases, the Fresnel reflection rate increases, and a reflection amount on the surface of the transparent 90 increases. With respect to the air and the glass, while the reflection amount is small when the incidence angle ranges from 0 to 45 degrees, the reflection amount gradually increases as the angle exceeds 45 degrees, and the light transmitting the light transmission plate 90 decreases. That is, influence of the external light is dominant until the incidence angle reaches 45 degrees. Accordingly, when a case of the incidence angle of 45 degrees is considered, W>H×tan θ=T×tan θ=T=H is obtained, and it can be said that it is sufficient to satisfy the relationships of W>T and W>H.

As described above, by setting the width of the peripheral circuit portion 73 of the color filter layer 70 to be thicker than or equal to the width of the joining member 80, it is possible to suppress reflection at the peripheral circuit region 13 by the external light received from the light transmission plate 90 and improve the image quality of the imaging apparatus.

Further, by not arranging the peripheral circuit portion 73 of the color filter layer 70 under the joining member 80, the interlayer delamination between the joining member 80 and the peripheral circuit portion 73 of the color filter layer 70 is suppressed, and it is thus possible to improve the yield and the environmental reliability. While the influence of the incident light from the outside of the imaging apparatus in the imaging apparatus is here illustrated as an example, the same influence may occur even by an incident light in the display apparatus described above from the outside of the display apparatus. Further, when the light generated inside the display apparatus described above is replaced with the incident light from the outside of the imaging apparatus reflected at the effective pixel region 11, the models of FIG. 3A and FIG. 3B can also be applied to the imaging apparatus.

Figure 6A:
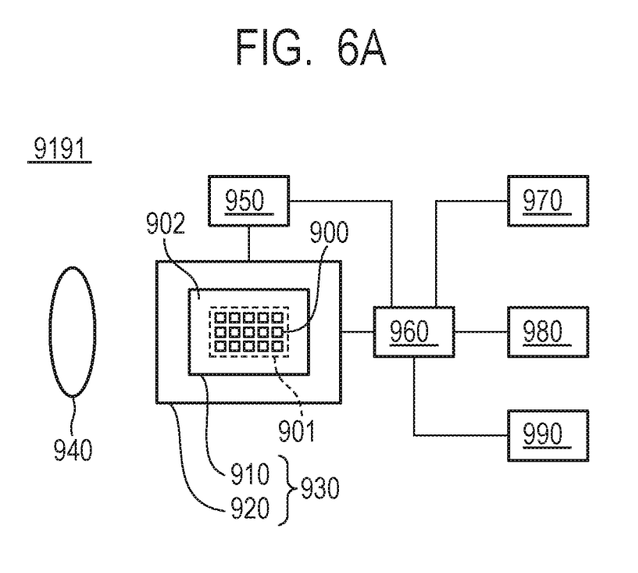
FIG. 6A is a schematic diagram illustrating a camera and apparatuses according to an embodiment of the present disclosure.

FIG. 6A is a schematic diagram of an equipment 9191 having a semiconductor apparatus 930. The equipment 9191 further has, in addition to the semiconductor apparatus 930, at least any one of an optical system 940, a control apparatus 950, a processing apparatus 960, a storage apparatus 970, a display apparatus 980, and a machinery apparatus 990.

The optical system 940 is associated with the semiconductor apparatus 930 and captures an image on the semiconductor apparatus 930. The control apparatus 950 controls the semiconductor apparatus 930. The processing apparatus 960 processes a signal output from the semiconductor apparatus 930. The storage apparatus 970 stores information obtained in the semiconductor apparatus 930. The display apparatus 980 displays information obtained in the semiconductor apparatus 930. The machinery apparatus 990 operates based on information obtained in the semiconductor apparatus 930. The machinery apparatus 990 may be a motion apparatus that causes the semiconductor apparatus 930 to move in the equipment 9191 or together with the equipment 9191. An image stabilizer function can be realized by causing the semiconductor apparatus 930 to move in the equipment 9191.

The semiconductor apparatus 930 may include a semiconductor device 910 (corresponding to the semiconductor device 100) and a mounting member 920. The semiconductor device 910 has a semiconductor layer (corresponding to the semiconductor substrate 10). The semiconductor device 910 includes an effective pixel region 901 (corresponding to the effective pixel region 11) in which function elements are arranged and a peripheral circuit region 902 (corresponding to the peripheral circuit region 13) in which peripheral circuits (not illustrated) are arranged.

The configuration of the semiconductor apparatus 200 in the embodiments described above can be applied to the semiconductor apparatus 930 in the equipment 9191. The peripheral circuit includes the drive circuit described above, an analog-to-digital (AD) (or digital-to-analog (DA)) conversion circuit, a digital signal processing circuit, a control circuit, or the like. While the effective pixel region 901 and the peripheral circuit region 902 may be arranged on the same semiconductor layer, the effective pixel region 901 and the peripheral circuit region 902 in the present example may be arranged on the separate semiconductor layers (the semiconductor substrate 10) stacked on each other.

The mounting member 920 includes a ceramic package, a plastic package, a printed circuit board, a flexible cable, a solder, a wire bonding, or the like. The optical system 940 includes a lens, a shutter, a filter, a mirror, for example. The control apparatus 950 is a semiconductor device such as an application specific integrated circuit (ASIC), for example. The processing apparatus 960 is a semiconductor device such as a central processing unit (CPU), an ASIC, or the like, for example, which forms an analog front end (AFE) or a digital front end (DFE), for example. The display apparatus 980 is an EL display apparatus or a liquid crystal display apparatus, for example. The storage apparatus 970 is a volatile memory such as an SRAM or a DRAM, or a nonvolatile memory such as a flash memory or a hard disk drive and is a magnetic device or a semiconductor device, for example. A machinery apparatus MCHN has a movable unit or driving unit such as a motor, an engine, or the like.

The equipment 9191 illustrated in FIG. 6A may be an electronic equipment such as an information terminal (for example, a smart phone or a wearable terminal) having an imaging function, a camera (for example, an interchangeable lens camera, a compact camera, a video camera, a surveillance camera), or the like. The machinery apparatus 990 in a camera can drive a component of the optical system 940 to perform zooming, focusing, or a shutter operation. Further, the equipment 9191 may be a transport equipment (moving body) such as a vehicle, a ship, an aircraft, an artificial satellite, or the like. The machinery apparatus 990 in a transport may be used as a moving apparatus. The equipment 9191 as a transport equipment is suitable for an equipment that transports the semiconductor apparatus 930 or an equipment that supports and/or automates driving (operation) by an imaging function. The processing apparatus 960 used for supporting and/or automating driving (operation) can perform a process used for operating the machinery apparatus 990 as a moving apparatus based on information obtained in the semiconductor apparatus 930. Further, the equipment 9191 may be an analytical apparatus or a medical equipment.

The semiconductor apparatus 930 according to the present embodiment can provide a high value to a designer, a manufacturer, a seller, a purchaser, and/or a user thereof. Therefore, by installing the semiconductor apparatus 930 in the equipment 9191, the equipment 9191 can also be improved. Accordingly, in manufacturing and selling the equipment 9191, decision of mounting the semiconductor apparatus 930 of the present embodiment on the equipment 9191 is advantageous in increasing the value of the semiconductor apparatus 930.

Figure 6B:
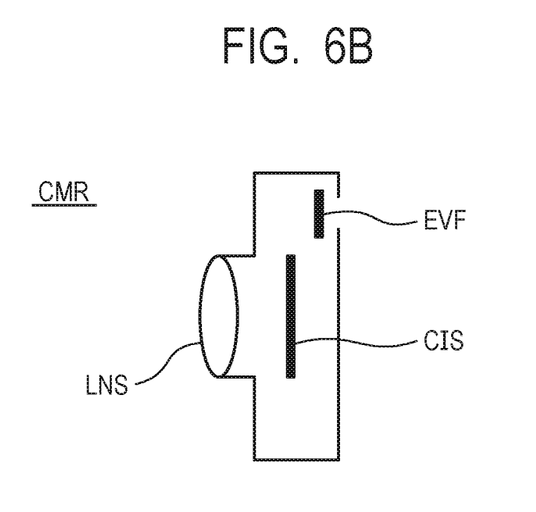
FIG. 6B is another schematic diagram illustrating the camera and the apparatuses according to an embodiment of the present disclosure.

A camera CMR illustrated in FIG. 6B has an image sensor CIS and an electronic viewfinder EVF. The electric viewfinder EVF is formed of the module 400 illustrated in FIG. 1A, and the display apparatus of the electronic viewfinder EVF is the semiconductor apparatus 200 described in the embodiments described above. A lens LNS used for capturing an image on the image sensor CIS may be replaceable. The camera CMR may be a non-reflex camera.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-205557, filed on Oct. 31, 2018, which is hereby incorporated by reference in its entirety.

What is claimed is:

1. A semiconductor apparatus comprising:
    a semiconductor device having an effective pixel region in which an effective pixel is provided and a peripheral region located in a periphery of the effective pixel region;
    a light transmission plate arranged so as to overlap the effective pixel region and the peripheral region in a plan view with respect to a primary face of the semiconductor device;
    a color filter layer arranged between the light transmission plate and the effective pixel region and between the light transmission plate and the peripheral region; and
    a joining member arranged between the light transmission plate and the peripheral region and configured to join the light transmission plate and the semiconductor device to each other,
    wherein at least a part of an outer edge of the color filter layer is located between the effective pixel region and an end of the semiconductor device in the plan view,
    wherein a first distance from the effective pixel region to the part in the plan view is greater than 100 times a second distance in a direction perpendicular to the primary face from the color filter layer to the light transmission plate arranged on the effective pixel region and smaller than a third distance from the part to the end of the semiconductor device, and
    wherein a thickness of at least a part of the joining member is greater than the second distance.

2. The semiconductor apparatus according to claim 1, wherein the second distance is greater than a thickness of the color filter arranged on the effective pixel region.

3. The semiconductor apparatus according to claim 1, wherein a distance from a part of the outer edge to the part of the joining member is greater than or equal to 500 µm.

4. The semiconductor apparatus according to claim 1, wherein the first distance is smaller than a fourth distance from the part of the outer edge to the part of the joining member.

5. The semiconductor apparatus according to claim 1,
    wherein the first distance is longer than or equal to 100 µm and smaller than or equal to 1000 µm,
    wherein the second distance is smaller than or equal to 50 µm, and
    wherein the third distance is greater than or equal to 500 µm.

6. The semiconductor apparatus according to claim 1, wherein, on the peripheral region, the color filter layer has a first portion in which multiple-color color filters are arranged in an array and a second portion in which single-color color filter extend, the first portion is located between the second portion and the effective pixel region, and a width of the second portion is equal to a width of the first portion or smaller than the width of the first portion.

7. The semiconductor apparatus according to claim 1, wherein the peripheral region includes a peripheral circuit region in which a peripheral circuit is arranged, and the color filter layer is arranged on the peripheral circuit region.

8. The semiconductor apparatus according to claim 7, wherein the peripheral region is located between the peripheral circuit region and the effective pixel region and includes a region in which a non-effective pixel is provided, and the color filter layer is arranged on the region in which the non-effective pixel is provided.

9. The semiconductor apparatus according to claim 1, wherein a blue color filter forms an entire circumference of the outer edge of the color filter layer.

10. The semiconductor apparatus according to claim 1, wherein the entire circumference of the outer edge of the color filter layer is located between the effective pixel region and the joining member in the plan view.

11. The semiconductor apparatus according to claim 1 further comprising: a resin layer arranged on the effective pixel region and the peripheral region, wherein the color filter layer is located between the resin layer and the semiconductor device, and the joining member is arranged between the resin layer and the light transmission plate.

12. The semiconductor apparatus according to claim 1, wherein the joining member includes a matrix made of a resin and a filler made of a resin distributed in the matrix.

13. The semiconductor apparatus according to claim 1 further comprising: a light transmission member that is provided between the color filter layer and the light transmission plate arranged on the effective pixel region and contacts with the light transmission plate.

14. The semiconductor apparatus according to claim 1, wherein the effective pixel region is provided with a plurality of pixel electrodes, an opposite electrode facing the plurality of pixel electrodes, and a function layer provided between the plurality of pixel electrodes and the opposite electrode, and the outer edge of the color filter layer overlaps the opposite electrode in the plan view.

15. The semiconductor apparatus according to claim 14, wherein a wiring structure is provided between the plurality of pixel electrodes and the semiconductor device, the opposite electrode has a contact portion of the opposite electrode and the wiring structure, and the outer edge of the color filter layer is located between the contact portion and the effective pixel region in the plan view.

16. The semiconductor apparatus according to claim 14, wherein the function layer is an organic light emitting layer.

17. The semiconductor apparatus according to claim 1 further comprising an electrode penetrating a semiconductor substrate included in the semiconductor device.

18. A camera comprising:
an image sensor; and
an electronic viewfinder,
wherein a display apparatus of the electronic viewfinder is the semiconductor apparatus according to claim 1.

19. The camera according to claim 18, wherein the color filter layer continuously extends between the effective pixel region and the part of the outer edge of the color filter layer.

20. An equipment comprising the semiconductor apparatus according to claim 1, the apparatus further comprising at least one of:
an optical system associated with the semiconductor apparatus;
a control apparatus that controls the semiconductor apparatus;
a processing apparatus that processes a signal output from the semiconductor apparatus;
a display apparatus that displays information obtained by the semiconductor apparatus;
a storage apparatus that stores information obtained by the semiconductor apparatus; and
a machinery apparatus that moves the semiconductor apparatus based on information obtained by the semiconductor apparatus.

21. The equipment according to claim 20, wherein the color filter layer continuously extends between the effective pixel region and the part of the outer edge of the color filter layer.

22. The semiconductor apparatus according to claim 1, wherein the color filter layer continuously extends between the effective pixel region and the part of the outer edge of the color filter layer.

23. A module comprising:
a semiconductor apparatus including:
a semiconductor device having an effective pixel region in which an effective pixel is provided and a peripheral region located in a periphery of the effective pixel region,
a light transmission plate arranged so as to overlap the effective pixel region and the peripheral region in a plan view with respect to a primary face of the semiconductor device,
a color filter layer arranged between the light transmission plate and the effective pixel region and between the light transmission plate and the peripheral region, and
a joining member arranged between the light transmission plate and the peripheral region and configured to join the light transmission plate and the semiconductor device to each other,
wherein at least a part of an outer edge of the color filter layer is located between the effective pixel region and an end of the semiconductor device in the plan view,
wherein a first distance from the effective pixel region to the part in the plan view is greater than 100 times a second distance in a direction perpendicular to the primary face from the color filter layer to the light transmission plate arranged on the effective pixel region and smaller than a third distance from the part to the end of the semiconductor device, and
wherein a thickness of at least a part of the joining member is greater than the second distance; and
a flexible circuit board connected to the semiconductor apparatus,
wherein, in the plan view, the part of the joining member is located between the part and an electrical connecting portion between the semiconductor apparatus and the flexible circuit board.

24. The module according to claim 23, wherein the color filter layer continuously extends between the effective pixel region and the part of the outer edge of the color filter layer.

* * * * *